United States Patent [19]

Dufrenne

[11] Patent Number: 4,639,569
[45] Date of Patent: Jan. 27, 1987

[54] WELD RESISTANCE MEASURING APPARATUS FOR A SPOT WELDER

[75] Inventor: Gerald Dufrenne, LaVerne, Calif.

[73] Assignee: Unitek Corporation, Monrovia, Calif.

[21] Appl. No.: 718,295

[22] Filed: Apr. 1, 1985

[51] Int. Cl.⁴ .............................................. B23K 11/24
[52] U.S. Cl. .................................. 219/109; 324/65 R
[58] Field of Search .............. 219/109, 110; 324/65 R

[56] References Cited

U.S. PATENT DOCUMENTS

| | | | |
|---|---|---|---|
| 3,621,193 | 11/1971 | Low | 219/109 |
| 4,503,311 | 3/1985 | Houchens et al. | 219/109 |

FOREIGN PATENT DOCUMENTS

| | | | |
|---|---|---|---|
| 84121 | 8/1971 | German Democratic Rep. | 219/109 |

OTHER PUBLICATIONS

C. A. Keskimaki, "Dynamic Resistance Spot Weld Analyzer", *Western Electric Technical Digest*, No. 46, 4/1977, pp. 21–22.

*Primary Examiner*—Clifford C. Shaw
*Attorney, Agent, or Firm*—Christie, Parker & Hale

[57] ABSTRACT

Apparatus provides for measuring weld resistance of each of a group of weld sites that are subject to variation with respect to weld resistance. The apparatus includes circuitry for inducing a flow of alternating current in a weld site. The magnitude of the induced alternating current is substantially constant; in particular, the percentage variation in its magnitude is substantially less than the percentage variation in resistance to which the weld sites are subject. The apparatus further includes voltage responsive circuitry for producing a signal representative of the magnitude of the resistance of the weld site.

22 Claims, 5 Drawing Figures

WELD RESISTANCE MEASURING APPARATUS FOR A SPOT WELDER

FIELD OF THE INVENTION

In general, this invention relates to resistance spot welders; more particularly, it relates to apparatus for use in preparation for spot welding to measure the magnitude of the resistance of a weld site.

BACKGROUND OF THE INVENTION

To produce uniformly strong, metallurgically-acceptable welds, a spot welder must be operated in a way that takes into account variations that exist in weld sites. Such variations exist because wire and the parts to which they are to be welded vary in thickness, surface finish cleanliness and purity. All of these mechanical variations affect the magnitude of the electrical resistance at the weld site. A typical range of site-to-site resistance variation is such that weld sites having a nominal or average resistance of about 15 milliohms are subject to a normal variation to a low of about 3 milliohms to a high of about 30 milliohms. This constitutes a percentage variation of +100% from the nominal to the high and of −80% from the nominal to the low. Such variations in the electrical resistance from one weld site to another will cause variations in the magnitude of instantaneous electrical power delivered to the weld sites if the same amount of instantaneous drive current is induced in the weld sites. Producing a strong, metallurgically-acceptable weld depends upon adhering to a weld schedule having limits involving time and power so as to deliver a right amount of energy within a right amount of time. If the amount of power being delivered is outside limits of the weld schedule a strong, metallurgically acceptable weld will not be produced.

Generally, spot welders include adjustment controls to enable an operator to select a desired setting for the magnitude and duration of the current that the spot welder will induce in a weld site. Thus, if the magnitude of the resistance at a weld site is ascertained in advance, it is possible for the operator to set the adjustment controls of the spot welder appropriately for the weld site. However, in a production setting, it is undesirable to take the time required to use the traditional method to measure the weld resistance.

The traditional method of measuring weld resistance is to pass a known d.c. test current through the series path defined by the welding electrodes of the spot welder and the weld site, and measure the resulting voltage that is developed across the welding electrodes. It is desirable to include the welding electrodes in this series path so that any effects caused by variations in contact area and pressure exerted by the welding electrodes is taken into account in the measurement. However, the welding electrodes are connected within the spot welder to the output drive circuitry and in almost all spot welders such output drive circuitry includes a transformer secondary winding, the opposite ends of which are connected to a respective one of the welding electrodes. If steps are not taken to disconnect the output winding during the measurement operation, the secondary winding would be in parallel with the resistance of the weld site, and the low resistance of the secondary winding would shunt the majority of the d.c. test current. Taking the time to disconnect the output winding is highly undesirable in a production setting. Further, there may be other reasons making it undesirable to disconnect circuitry from the transformer. For example, the spot welder drive circuitry typically is designed such that its proper operation depends in part on the load impedance it drives, and disconnecting such drive circuitry from the transformer can adversely affect the operation of such drive circuitry.

SUMMARY OF THE INVENTION

This invention provides apparatus for measuring weld resistance of each of a group of weld sites that are subject to variation with respect to weld resistance. Preferably, the apparatus is incorporated within a spot welder.

The apparatus comprises measuring circuit means having an input for connection in parallel with the weld site to be measured, and test-signal-generating means for inducing a flow of alternating current through the weld site. According to a highly advantageous feature, the alternating current has a substantially constant magnitude. In particular, the percentage variation in the magnitude of the alternating current is substantially less than the percentage variation in resistance to which the weld sites are subject. The measuring circuit means includes means responsive to voltage developed at its input for producing a signal representing the magnitude of the resistance of the weld site. Preferably, the apparatus further includes a meter responsive to the produced signal for providing a visual indication of the magnitude of the resistance of the weld site.

In the preferred embodiment in which the apparatus is incorporated within a spot welder, the spot welder has a test mode of operation and a welding mode of operation. The spot welder includes means defining welding electrodes for connection to a welding site, and drive circuit means including a transformer having an output winding connected to the welding electrodes for supplying welding current to the weld site during the welding mode of operation. Because of the advantageous features of this invention, there is no need to disconnect the transformer output winding during the test mode of operation. The spot welder further comprises measuring circuit means having an input for connection in parallel with the weld site and said output winding, and test-signal-generating means. During the test mode of operation, the test-signal-generating means induces a flow of alternating current through the weld site. The alternating current has a substantially constant magnitude. In a specific embodiment described below, the alternating current has a frequency of about 1200 Hz. This is a suitable frequency because at or about such frequency, the output impedance of the output winding is about 250 milliohms, which is many times larger than even the highest resistance value (30 milliohms) within a typical normal range. Circuit analysis indicates that variation of site-to-site weld resistance of +100% (from 15 milliohms to 30 milliohms) and of −80% (from 15 milliohms to 3 milliohms) results in a variation in the magnitude of the alternating current of only about −5.4% to about +4.7%. The measuring circuit means includes means responsive to voltage developed at its input for producing a signal representing the magnitude of the resistance at the weld site.

The foregoing and other distinguishing and advantageous features of the invention are described in more detail below and set out in the appended claims.

DETAILED DESCRIPTION OF A SPECIFIC EMBODIMENT

Figure 1:
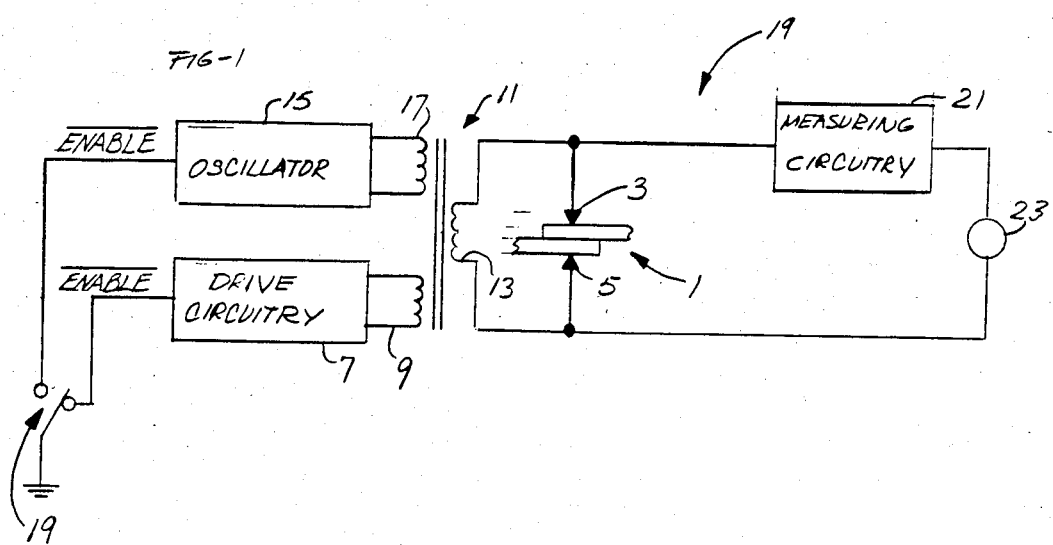
FIG. 1 is a block and schematic diagram showing the general organization of the preferred embodiment of this invention.

In FIG. 1, there is schematically represented a weld site 1 of a group of weld sites that are subject to site-to-site variation in resistance value. A spot welder incorporating apparatus according to this invention has welding electrodes 3 and 5 that are placed in position to contact and exert pressure on weld site 1. The spot welder includes drive circuitry 7. Suitable drive circuitry is described and claimed in a patent application titled "Direct Current Pulse Welder", U.S. Ser. No. 595,059, filed Mar. 30, 1984, in the name of the present inventor and assigned to the assignee of this invention.

Drive circuitry 7 is connected to a primary winding 9 of a transformer 11. The secondary winding 13 of the transformer has its opposite ends connected to welding electrodes 3 and 5, respectively. Thus, the secondary winding 13 is in parallel circuit relationship with the series resistance path defined by welding electrode 3, the resistance of weld site 1, and welding electrode 5.

An oscillator 15 is connected to a tertiary winding 17 of transformer 11. Preferably, as explained below, oscillator 15 is keyed on and off, and is on during a test mode of operation and off during a welding mode of operation. A single-pole, two-position switch 19 controls the keying on and off of oscillator 15. To turn oscillator 15 on, switch 19 is placed in position to connect ground (i.e. 0 volts) to the $\overline{\text{ENABLE}}$ input of oscillator 15. While the oscillator is on, it cooperates with transformer 11 to form a test signal generating means for inducing a flow of alternating current through the weld site. Suitably, this alternating current has a frequency of about 1200 Hz.

A highly advantageous feature of apparatus embodying this invention is that the magnitude of the 1200 Hz. alternating current is substantially constant. The extent to which it varies depends on various factors that affect the output impedance of secondary winding 13.

Because of the need to provide relatively high drive current during a welding operation, transformer 11 has a high turns ratio between its primary winding 9 and its secondary winding 13. In a specific embodiment, this turns ratio equals 50. The output impedance of winding 13 is inversely proportional to the square of the turns ratio, and is directly proportional to the output impedance of drive circuitry 7. In a specific embodiment, the output impedance of drive circuitry 7 is about 600 ohms, and accordingly the output impedance of secondary winding is about 250 milliohms. Thus, the output impedance of winding 13 is many times a nominal weld resistance of 15 milliohms.

The 1200 Hz alternating current flowing through the weld resistance is inversely proportional to the quantity $(1+Rm/Ro)$, where Rm is the resistance being measured and Ro is the output impedance of winding 13. Because Ro is much larger than Rm, the quantity $(1+Rm/Ro)$ changes less in percentage than the percentage change in Rm. In particular, the quantity changes only $-5.36\%$ as a result of a 100% increase in Rm from 15 milliohms to 30 milliohms. The quantity changes only $+4.74\%$ as a result of an 80% decrease in Rm from 15 milliohms to 3 milliohms.

The measuring circuitry 21 is responsive to voltage developed at its input to produce a signal it supplies to meter 23. This signal represents the magnitude of the resistance of the weld site, and the meter 23 provides a visual indication thereof.

Figure 2:
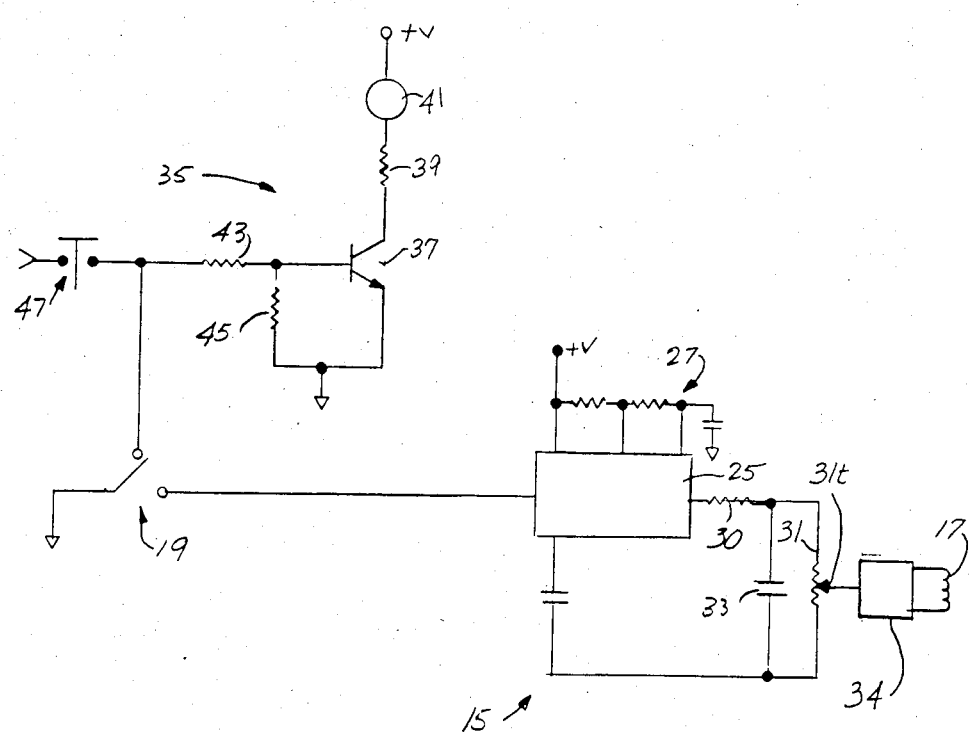
FIG. 2 is a block and schematic diagram showing in more detail the oscillator of FIG. 1 together with associated circuit elements.

As shown in more detail in FIG. 2, oscillator 15 comprises a conventional integrated circuit 25 and an associated frequency-determining circuit 27. Suitably, the integrated circuit is a 555 timer circuit of the kind sold by various integrated circuit manufacturers. Such a 555 timer circuit is described in a catalog titled *Linear Integrated Circuits*, published by National Semiconductor Corporation.

Oscillator 15 is keyed on by closing a switch 19 so as to apply ground (i.e., 0 volts) to the ground input terminal of the circuit 25. While keyed on, oscillator 15 produces an oscillating voltage having a generally square wave shape that is applied to a resistor 30. A potentiometer 31 and a capacitor 33 are connected in parallel between one end of resistor 30 and ground, to provide for filtering high frequency components of the square wave.

Figure 5:
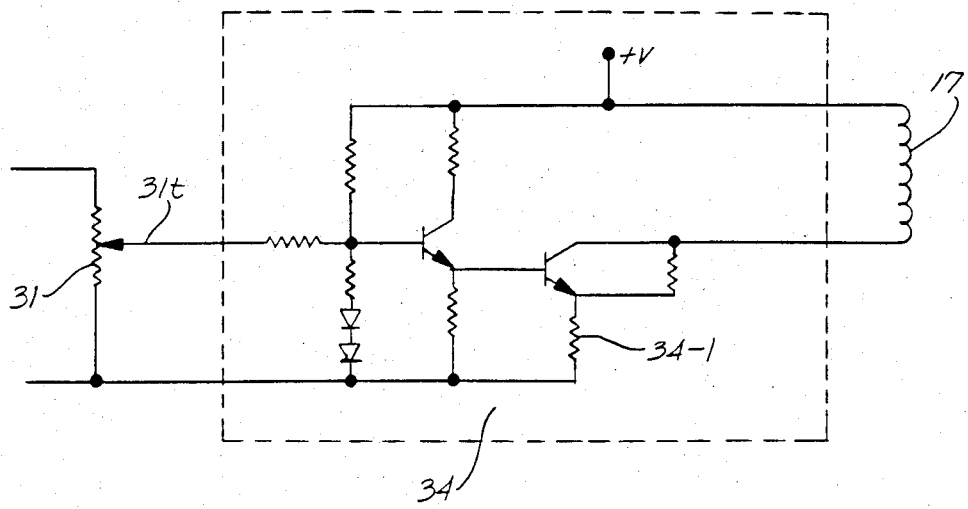
FIG. 5 is a schematic of suitable circuitry for the constant current drive circuit 34 of FIG. 2.

A tap 31t on the potentiometer is provided. A conventional constant current drive circuit 34 is connected between the tap 31t and the transformer input winding 17. FIG. 5 shows a suitable constant current drive circuit, which includes conventional, tandem-connected emitter followers that operate to produce a substantially constant magnitude voltage across a resistor 34-1. Because the magnitude of this voltage is substantially constant, the output drive current flowing through the output stage emitter follower to winding 17 is substantially constant in magnitude.

FIG. 2 also shows switching means including circuitry 35 that facilitates high speed use of the spot welder in the course of a series of cyclical operations each involving a resistance measurement and then a weld. Circuitry 35 includes a switching transistor 37 that, when switched on, supplies current through resistor 39 and a buzzer or audible alarm 41. The switching transistor 37 is connected to a bias network comprising resistors 43 and 45. One end of resistor 43 is connected to switch 19 and also to a fire switch 47.

When fire switch 47 closes, it completes a series circuit path. If switch 19 is closed (this switch is closed during resistance measuring), current supplied by conventional circuitry (not shown) within the spot welder flows through fire switch 47 and resistor 43 to turn on switching transistor 37. This causes the alarm to sound, and alerts the operator to view the meter 23 (FIG. 1).

While switch 19 is open, as it is during an actual welding operation, closure of switch 19 does not result in sounding the buzzer because switch 19 switches the current flowing through the fire switch 47 to ground. The foregoing arrangement makes it practical in a production setting to perform each cycle rapidly. The operator presses a button to close switch 19 and, while holding the button down, listens for the buzzer. The sounding of the buzzer prompts the operator to inspect the meter to decide whether there is a need to reset the adjustment controls of the spot welder. When the operator releases the button, switch 19 opens and the welding operation immediately takes place.

Figure 3:
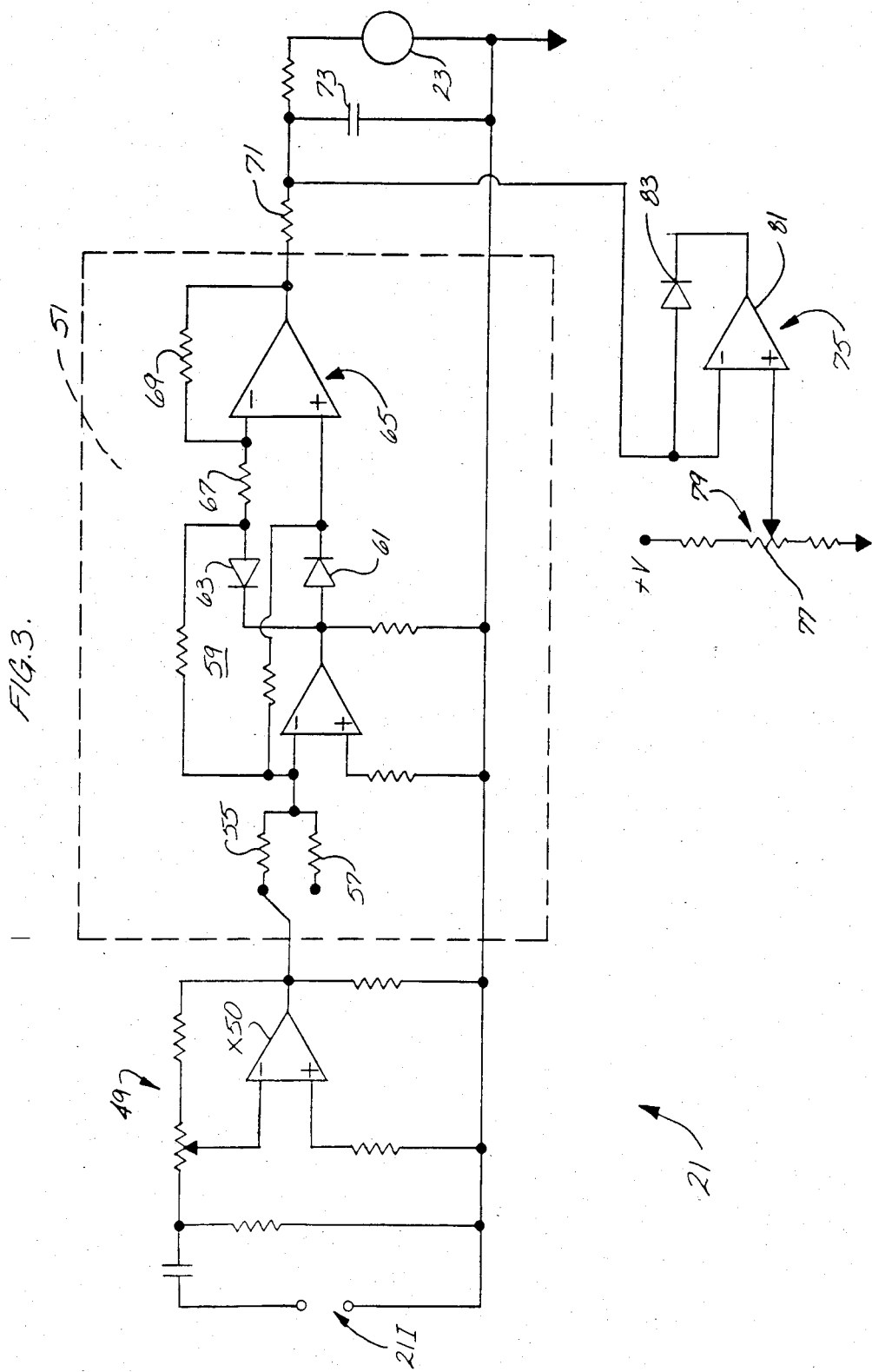
FIG. 3 is a block and schematic diagram showing in more detail the measuring circuitry of FIG. 1 together with associated circuit elements.

With reference to FIG. 3, the details of measuring circuitry 21 will now be described. The input 21I to measuring circuitry 21 senses voltage developed across the series path (FIG. 1) comprising welding electrode 3, weld site 1, and welding electrode 5. This voltage is amplified by a conventional operational amplifier feedback circuit 49. Suitably, the circuit 49 has a voltage gain of 50. The output of circuit 49 is applied to a full wave rectifier circuit arrangement 51. Preferably, circuit arrangement 51 includes a gain selection switch 53. Depending upon the position of switch 53, either a resistor 55 or a resistor 57 forms the input resistor of an operational amplifier feedback circuit 59. Diodes 61 and 63 are connected in parallel feedback paths of circuit 59. The cathode of diode 61 is also connected to the non-investing input terminal of a operational amplifier feedback circuit 65. The anode of diode 63 is also connected to an input resistor 67 which, together with a feedback resistor 69, determines the gain of circuit 65. The output of circuit 65 is a full-wave rectified and amplified signal having a d.c. value corresponding to the resistance of the weld site 1. An R-C filtering network including resistor 71 and capacitor 73 is provided between the output of circuit 65 and the meter 23.

Preferably, a threshold-sensitive clamping circuit 75 is provided to protect the meter. Clamping circuit 75 is connected to one end of resistor 71 between rectifier 51 and meter 23. The threshold to which circuit 75 is sensitive is set by a potentiometer 77 in a series circuit 79. The voltage developed at the tap of potentiometer 77 is applied to the non-inverting input of an operational amplifier 81. A diode 83 defines the feedback path for amplifier 81 and is poled such that if the voltage developed at the non-inverting input is slightly more positive than the threshold voltage at the non-inverting input, the diode conducts, and thereby clamps. So long as the voltage at the non-inverting input is less positive than the threshold, diode 83 does not conduct and accordingly the clamping circuit 75 has virtually no effect on the signal going to the meter 23.

Figure 4:
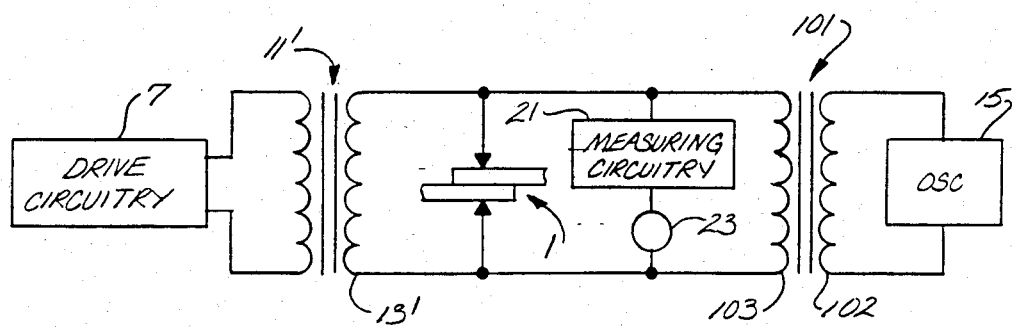
FIG. 4 is a block and schematic diagram showing the general organization of an alternative embodiment of this invention.

The above-described specific embodiment constitutes an example of numerous embodiments within the scope of this invention. By way of an additional example, FIG. 4 shows the general arrangement of an alternative embodiment in which the test-signal generating means is defined by a separate transformer 101 rather than employing a tertiary winding of transformer 11. In this alternative embodiment, oscillator 15 applies an a.c. test voltage to the primary winding 102 of transformer 110. The secondary winding 103 of the transformer 101 has its opposite ends connected across the parallel circuitry comprising the other transformer secondary winding 13', the weld site 1, and the measuring circuitry 21 in series with the meter 23. Because the output impedance of secondary winding 13' is much higher than the weld resistance, it does not shunt an appreciable amount of current, and the overwhelming portion of the test current supplied to secondary winding 103 flows through a weld site 1. It also bears mention that many other known circuits can be employed to define an oscillating signal for use in inducing alternating current. Instead of using an oscillator, frequency multiplying circuits and the like can respond to an a.c. power supply to generate the oscillating signal.

I claim:

1. Apparatus for measuring weld resistance of each of a group of weld sites that are subject to variation with respect to weld resistance from a nominal weld resistance in a range of about +100% to −80% of nominal weld resistance, which comprises:
    (a) measuring circuit means having an input for connection in parallel with a weld site to be measured;
    (b) test signal generating means for inducing a flow of alternating current through the weld site such that the percentage variation in the magnitude of the alternating current from a nominal magnitude is in a range of about −5.5% to +5% of the nominal magnitude; and
    (c) the measuring circuit means including means responsive to voltage developed at said input as a result of the flow of the alternating current through the weld site for producing a signal representative of the magnitude of the resistance of the weld site.

2. Apparatus according to claim 1, and further comprising a meter responsive to said signal for providing a visual indication of the magnitude of the resistance of the weld site.

3. Apparatus according to claim 2, wherein the means for producing said signal includes rectifier means and wherein said meter is responsive to direct current flowing through it.

4. Apparatus according to claim 3, wherein said rectifier means includes full wave rectifying means.

5. Apparatus according to claim 3, and further comprising threshhold-sensitive clamping circuit means connected between the rectifier means and the meter for protecting the meter.

6. Apparatus according to claim 1, wherein said test-signal-generating means includes an oscillator.

7. Apparatus according to claim 6, wherein said test-signal-generating means includes transformer means for connection between said oscillator and the weld site.

8. In a spot welder having drive circuit means and welding electrodes for connection to each of a group of weld sites that are subject to variation with respect to weld resistance, the drive circuit means having an output for supplying welding current through the welding electrodes to the connected weld site, apparatus to selectively supply welding current or alternating current for measuring weld resistance of the connected weld site, the improvement which comprises:
    (a) measuring circuit means having an input for connection in parallel with the weld site and said output;
    (b) test-signal-generating means for inducing a flow of alternating current through the weld site such that the percentage variation in the magnitude of the alternating current is substantially less than the percentage variation to which resistance weld sites are subject; and
    (c) the measuring circuit means including means responsive to voltage developed at said input as a result of the flow of the alternating current through the weld site for producing a signal representative of the magnitude of the resistance of the weld site.

9. Apparatus according to claim 8, and further comprising a meter responsive to said signal for providing a visual indication of the magnitude of the resistance of the weld site.

10. Apparatus according to claim 9, wherein the means for producing said signal includes rectifier means and wherein said meter is responsive to direct current flowing through it.

11. Apparatus according to claim 10, wherein said rectifier means comprises full wave rectifying means.

12. Apparatus according to claim 10, and further comprising a threshhold-sensitive clamping circuit means connected between the rectifier means and the meter for protecting the meter.

13. Apparatus according to claim 8, wherein said test-signal-generating means includes an oscillator.

14. Apparatus according to claim 13, wherein said test-signal-generating means includes transformer means for connection between said oscillator and the weld site.

15. Apparatus according to claim 14, wherein said transformer means comprises a winding on a transformer having a secondary winding that, in a test mode of operation, forms part of the test-signal-generating means, and, in a welding mode of operation, forms part of the output for supplying welding current.

16. A spot welder having a test mode of operation, and a welding mode of operation, the spot welder comprising:
 (a) means defining welding electrodes for connection to each of a group of weld sites that are subject to variation with respect to weld resistance;
 (b) drive circuit means including a transformer having an output winding connected to the welding electrodes for supplying welding current to the connected weld site during the welding mode of operation;
 (c) measuring circuit means having an input for connection in parallel with the weld site and said output winding;
 (d) test-signal-generating means for operating during the test mode of operation to induce a flow of alternating current through the connected weld site such that the percentage variation in the magnitude of the alternating current is substantially less than the percentage variation in resistance to which the weld sites are subject; and
 (e) the measuring circuit means including means responsive to voltage developed at said input as a result of the flow of the alternating current through the weld site for producing a signal representing the magnitude of the resistance of the weld site.

17. A spot welder according to claim 16, and further comprising a meter for providing a visual indication of the magnitude of the resistance of the weld site.

18. A spot welder according to claim 17, and further including prompting means for giving an alert when the meter is providing the proper visual indication.

19. A spot welder according to claim 18, and further comprising manually controlled means for switching between the test mode of operation and the welding mode of operation.

20. A spot welder according to claim 16, wherein the test-signal-generating means comprises transformer means.

21. A spot welder according to claim 20, wherein the transformer means comprises a tertiary winding of the transformer forming part of the drive circuit means.

22. A spot welder according to claim 20, wherein the transformer means comprises a secondary winding connected to a parallel circuit, one circuit path of which is defined by the output winding.

* * * * *